United States Patent
Huang

(10) Patent No.: US 7,358,176 B2
(45) Date of Patent: Apr. 15, 2008

(54) SCREEN PRINTING METHOD OF FORMING CONDUCTIVE BUMPS

(75) Inventor: Min-Lung Huang, Kaohsiung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 329 days.

(21) Appl. No.: 11/136,413

(22) Filed: May 25, 2005

(65) Prior Publication Data

US 2005/0266674 A1  Dec. 1, 2005

(30) Foreign Application Priority Data

May 26, 2004  (TW)  ............... 93114943 A

(51) Int. Cl.
*H01L 21/44* (2006.01)

(52) U.S. Cl. ............... 438/613; 438/672; 101/129

(58) Field of Classification Search ............... 438/613, 438/675, 672, 671, 666; 101/129
See application file for complete search history.

(56) References Cited

U.S. PATENT DOCUMENTS

| 4,229,400 | A | | 10/1980 | Laurie | |
| 4,950,623 | A | * | 8/1990 | Dishon | 438/614 |
| 6,063,646 | A | * | 5/2000 | Okuno et al. | 438/107 |
| 6,074,893 | A | * | 6/2000 | Nakata et al. | 438/106 |
| 6,264,097 | B1 | * | 7/2001 | Sano | 228/245 |
| 6,576,541 | B2 | * | 6/2003 | Hu | 438/614 |
| 6,763,585 | B2 | * | 7/2004 | Suzuki | 29/877 |
| 6,815,324 | B2 | * | 11/2004 | Huang et al. | 438/612 |

FOREIGN PATENT DOCUMENTS

| JP | 6-204229 | * | 7/1994 |
| KR | 97077387 | * | 12/1997 |

\* cited by examiner

*Primary Examiner*—M. Wilczewski
(74) *Attorney, Agent, or Firm*—Birch, Stewart, Kolasch & Birch, LLP

(57) ABSTRACT

A screen printing method of conductive material is applied to a wafer with a conductive surface thereon. A dielectric layer on the wafer exposes the conductive surface to a first opening. A mask formed on the dielectric layer has a plurality of second openings corresponding to the first opening. The conductive surface is exposed by the second openings. The conductive surface is covered with a conductive material that flows into the first opening through the second openings. Then the mask is removed. With the arrangement and dimension control of the second openings, the conductive material easily flows into the first opening and is not over-scraped.

15 Claims, 5 Drawing Sheets

SCREEN PRINTING METHOD OF FORMING CONDUCTIVE BUMPS

BACKGROUND OF THE INVENTION

1. Field of the Invention

The present invention generally relates to a formation method of conductive bumps. In particular, the present invention relates to a formation method of conductive bumps by a screen printing method.

2. Description of the Prior Art

FIG. 1A to FIG. 1C are schematically diagrams illustrating the formation of conductive bumps in accordance with a prior art. Referring to FIG. 1A, a semiconductor device 101, such as a silicon wafer including a passivation layer, a bonding zone 103 and a dielectric layer 105A. The bonding zone 103 in an opening 105B is implemented by the partial removal of the dielectric layer 105A. FIG. 1C is a top-view diagram with respect to FIG. 1A, in which the bonding zone 103 exposed by the opening 105B is a whole bulk area.

Next, Referring to FIG. 1B, conductive material 109 is filled into the opening 105B to cover the bonding zone 103. The conductive material 109, such as a solder material, is filled into the opening 105B with the help of a screen printing technology. However, if the excess conductive material 109 would be scraped off after the step of screen printing, the conductive material 109 on the bonding zone 103 is possible to be scraped off to result in a recess surface on the opening 105B. The condition of the recess surface is serious with the increase of the dimension of the opening 105B. Accordingly, it is important to prevent both the short of and uniform distribution of the conductive material for the formation of conductive bumps.

SUMMARY OF THE INVENTION

For the uniform distribution for the formation of conductive bumps, the formation of conductive bumps is provided. With the use of openings on a stencil, the conductive bumps are formed with the sufficient amount and the height to electrically connect with other circuits or devices.

Accordingly to one embodiment of the present invention, a screen printing method of conductive material is applied to a wafer with a conductive surface thereon. A dielectric layer on the wafer exposes the conductive surface to a first opening. A mask formed on the dielectric layer has a plurality of second openings corresponding to the first opening. The conductive surface is exposed by the second openings. The conductive surface is covered with a conductive material that flows into the first opening through the second openings. Then the mask is then removed. With the arrangement and dimension control of the second openings, the conductive material easily flows into the first opening and is not over-scraped.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENT

Figure 1A:
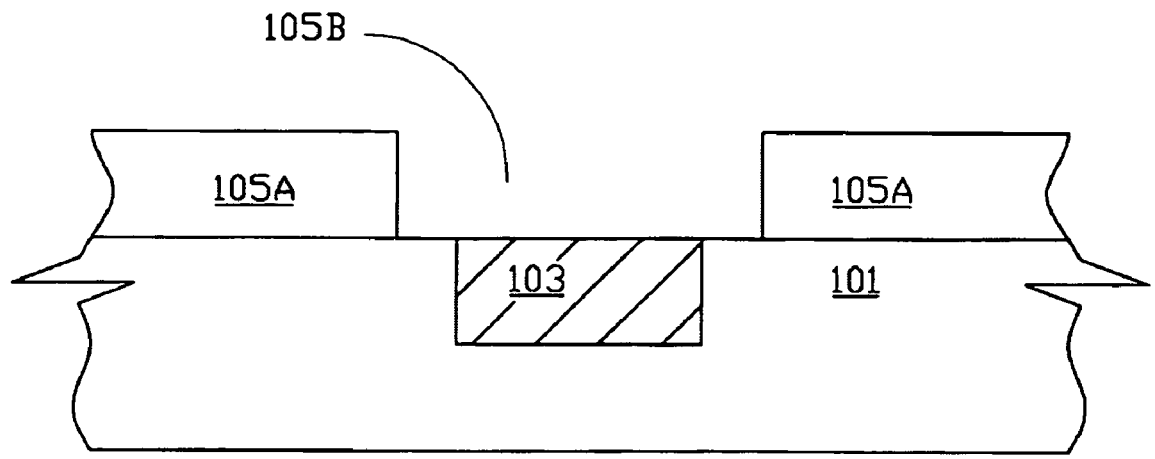
FIG. 1A and FIG. 1B are cross-sectional diagrams illustrating the formation of conductive bumps in accordance with a prior art.
Figure 1B:
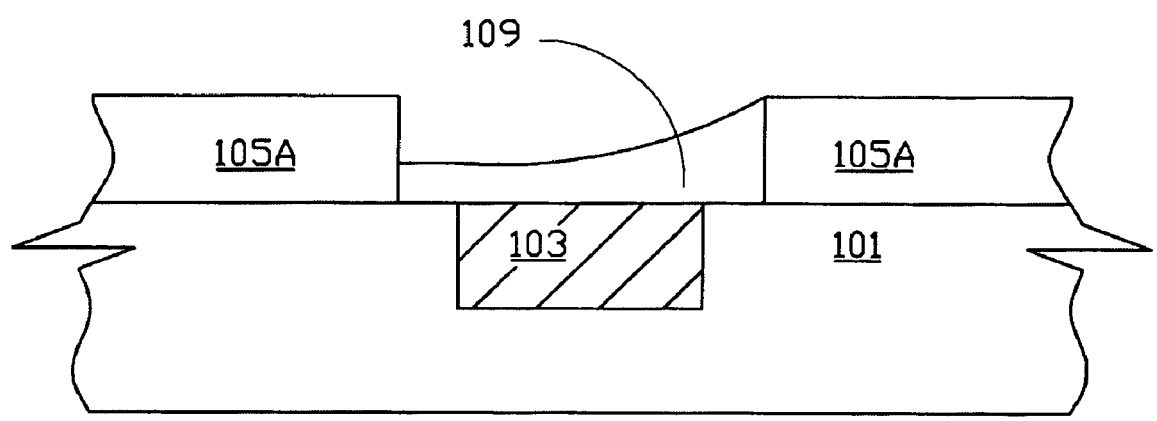
Figure 1C:
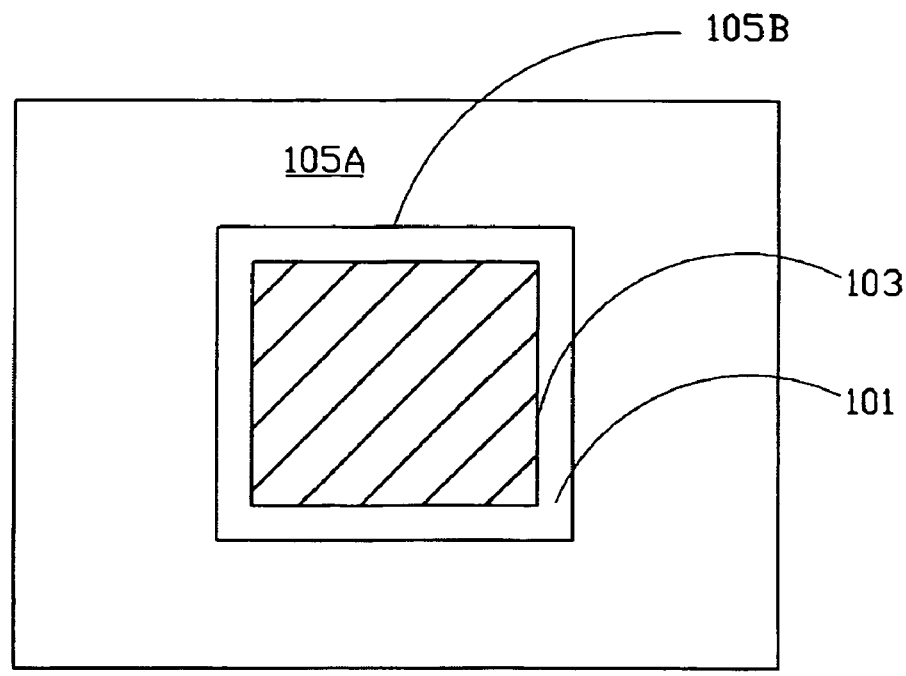
FIG. 1C is a top-view diagram with respect to FIG. 1A.
Figure 2A:
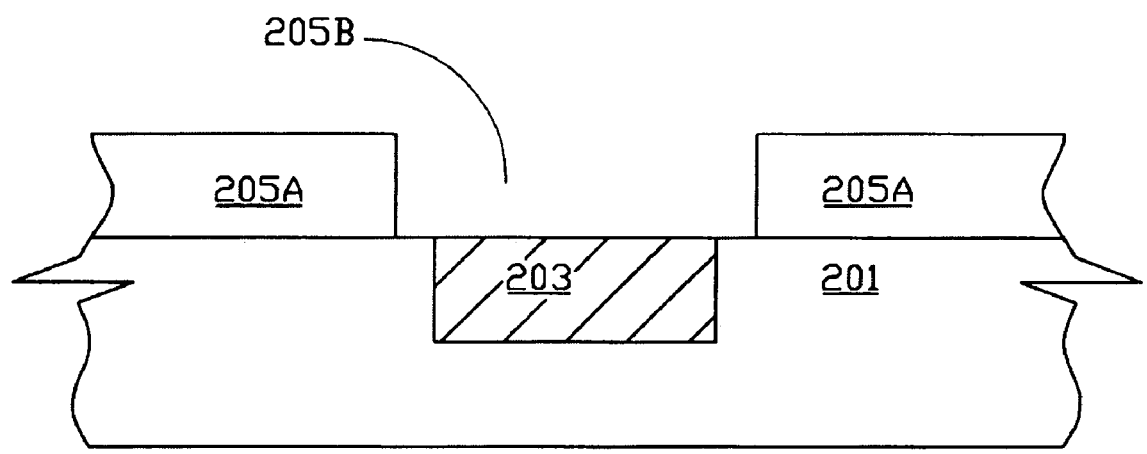
FIG. 2A to FIG. 2D are cross-sectional diagrams illustrating the formation of conductive bumps in accordance with one embodiment of the present invention.

Referring to FIG. 2A, a semiconductor device 201, such as a silicon wafer with a passivation layer having a bonding zone 203 and a dielectric layer 205A. In one embodiment, the bonding zone 203 includes a bonding pad (not shown) overlaid by an Under Bump Metallurgy (UBM). The UBM, implemented by the definition of the passivation layer and the sequential removal of the patterned dielectric layer 205A, is exposed a conductive surface within a first opening 205B. Alternatively, the bonding zone 203 is a portion of a redistribution layer if the semiconductor device 201 includes a solder pad and a conductive redistribution layer electrically connected to the solder pad. Furthermore, the dielectric layer 205A configured for dissipating stress is made of a material capable of pattern transferring, such as a stencil or a photo-resist stencil. In another embodiment, in addition of the first opening 205B, the dielectric layer 205A would include multitudes of scribing zone (not shown). FIG. 2E is a top-view diagram with respect to FIG. 2A, in which the bonding zone 203 exposed by the first opening 205B is a whole bulk zone.

Figure 2B:
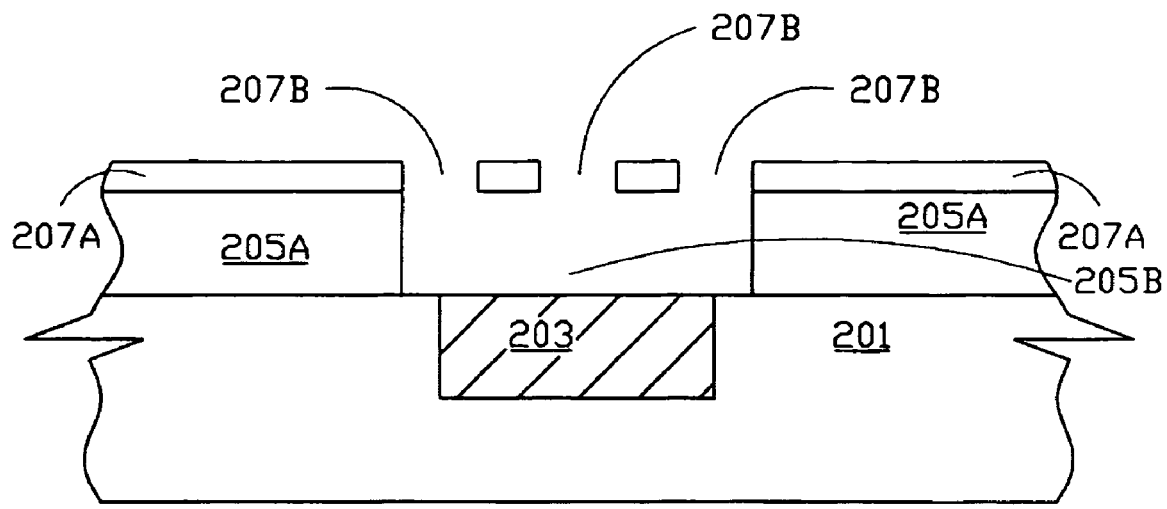

Referring to FIG. 2B, a mask 207A formed on the dielectric layer 205A has multitudes of second opening 207B to expose the bonding zone 203. In one embodiment, the mask 207A, such as a photo-resist stencil, has the second opening 207B positioned on the first opening 205B. In the embodiment, some second openings 207B, for example three openings, are positioned within the range of a single first opening 205B. Consideration on the portal dimension, the area enclosed by the first opening 205B is larger than the summary area enclosed by the corresponding second opening 207B. FIG. 2F is a top-view diagram with respect to FIG. 2B, in which some parallel stripes of the mask 207A cross the first opening 205B to expose the bonding zone 203 with the corresponding stripy second opening 207B. Thus, the exposed bonding zone 203 includes multitudes of isolated zones.

Figure 2C:
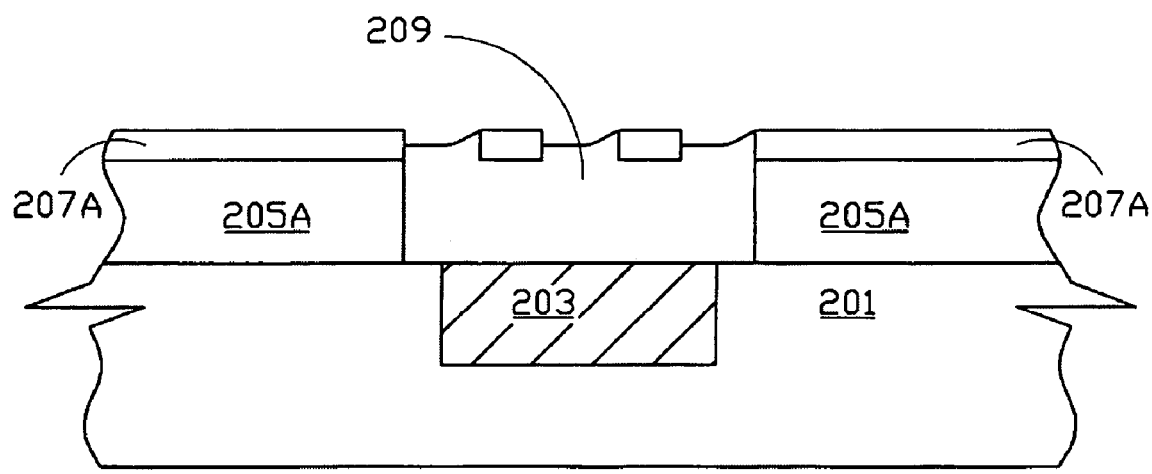
Figure 2D:
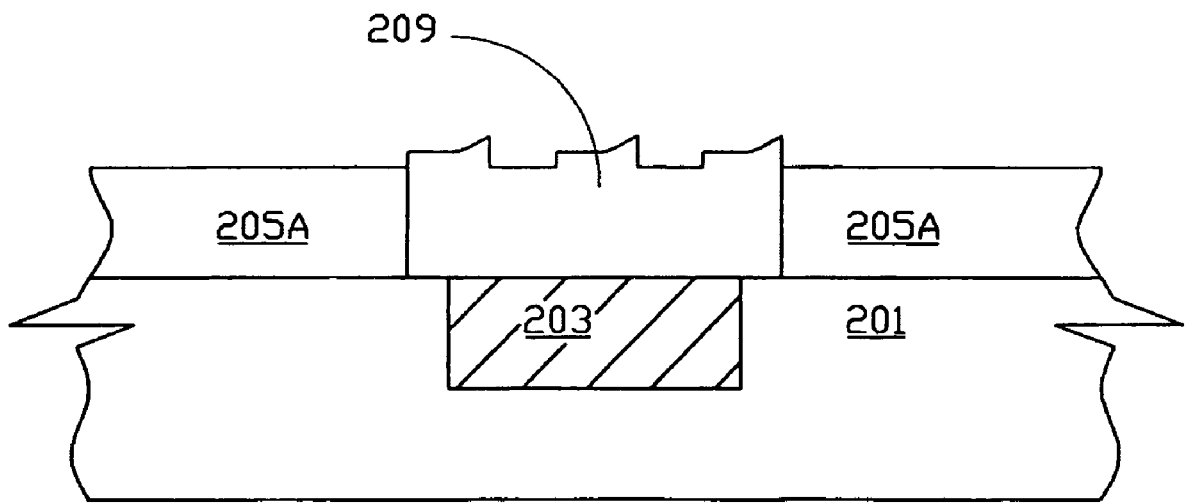
Figure 2E:
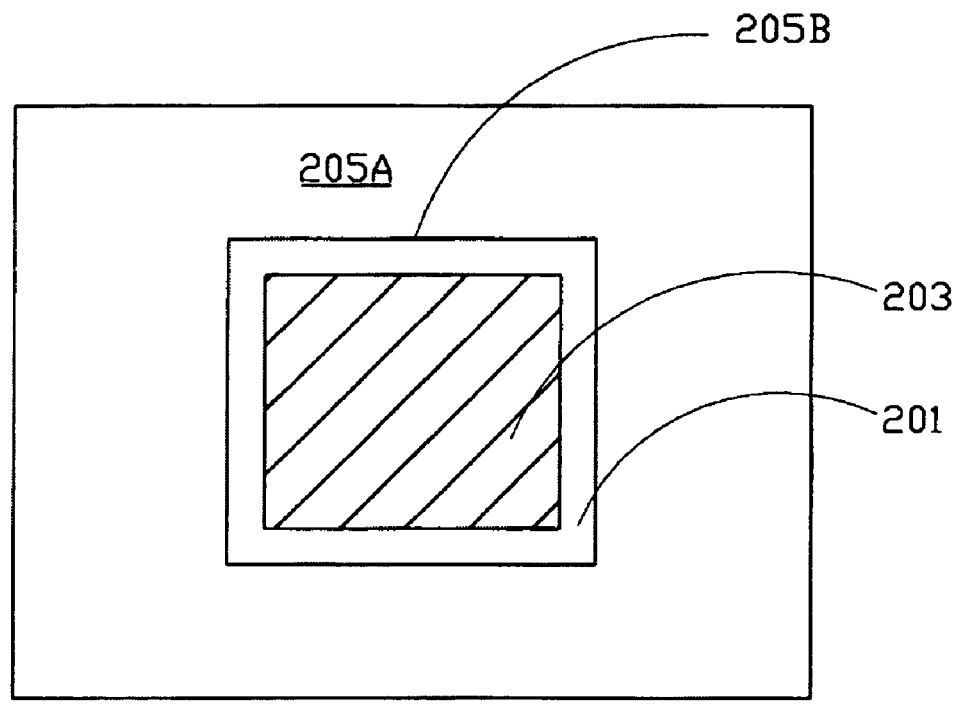
FIG. 2E is a top-view diagram with respect to FIG. 2A.
Figure 2F:
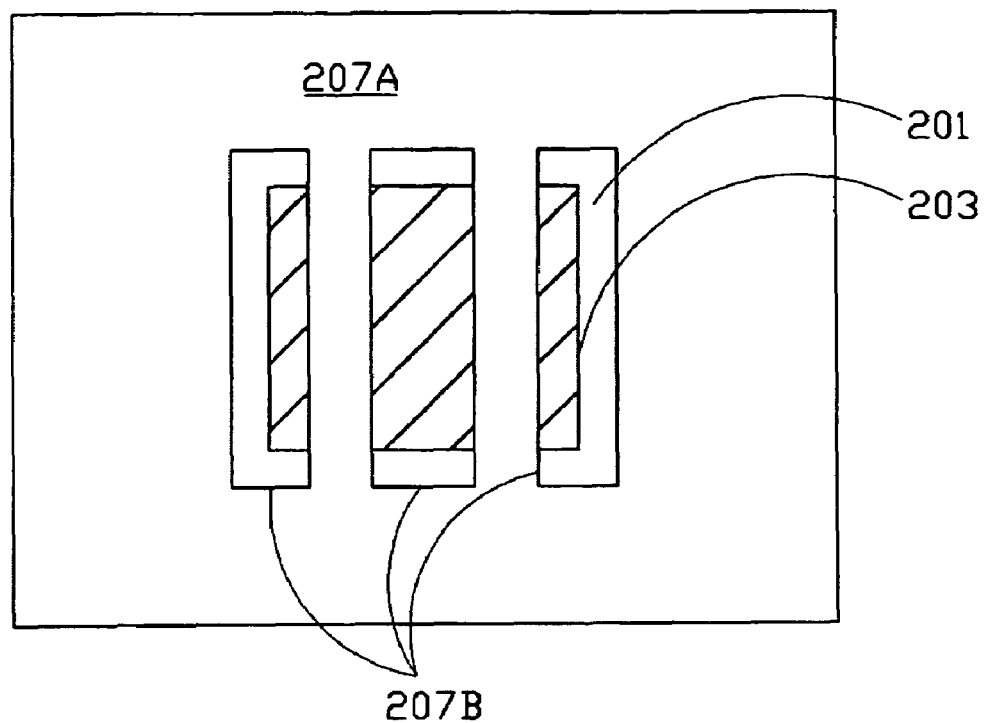
FIG. 2F is a top-view diagram with respect to FIG. 2B.

Next, shown in FIG. 2C, a conductive material 209 flows into the first opening 205B through the second opening 207B to cover the bonding zone 203. In the embodiment, for example, the first opening 205B with the dimension more than 250 micrometers, the use of the mask 207A with the stripes crossing the first opening 205B prevents the conductive material 209 in the first opening 205B or in the second opening 207B from the formation of recess surface. Furthermore, the conductive material 209 would flow into the space under the mask 207A through the second opening 207B, such as the second opening 207B with the dimension of 70 to 150 micrometers. The conductive material 209, such as a solder material, is filled into the first opening 205B by the screen printing. It is noted that the excess conductive material 209 is easily scraped off with the protection of the parallel stripes of the mask 207A on the bonding zone 203. Next, the conductive material 209 is reflowed followed by the removal of the mask 207A.

Figure 2G:
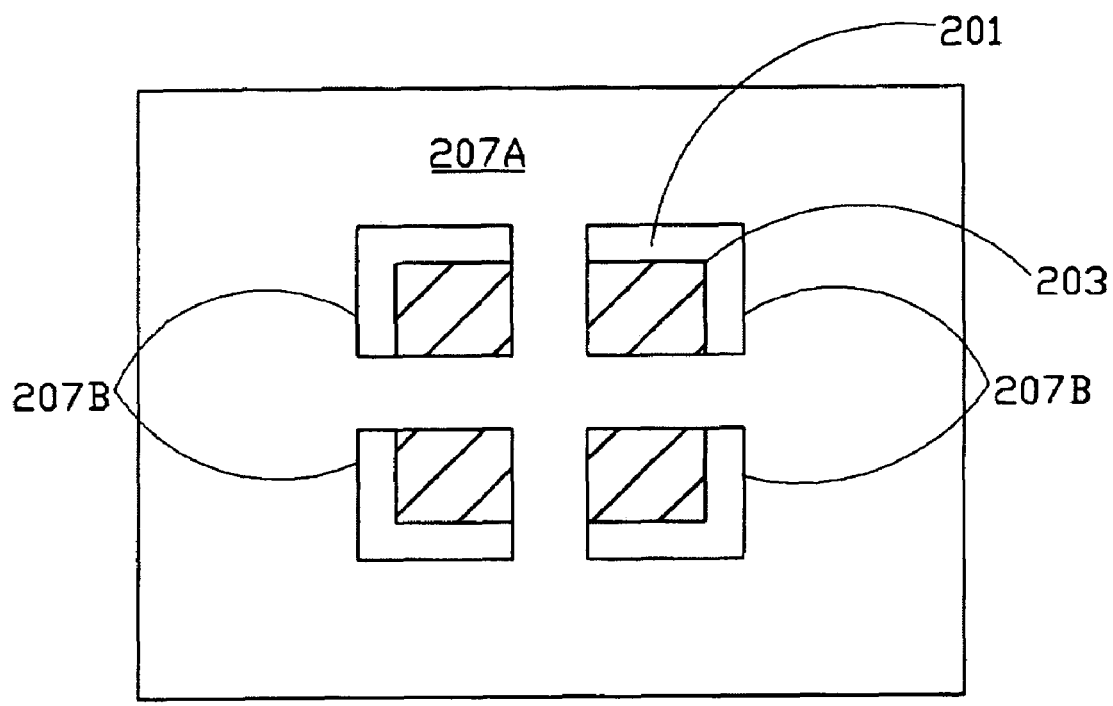
FIG. 2G is a top-view diagram illustrating a mask with the square openings in accordance with one embodiment of the present invention.

It is noted that the present invention is not limited to the mask 207A with the parallel stripes aforementioned. FIG. 2G, the mask 207A with the stripes crossing each other is on the first opening 205B to form four second openings 207B in the square shapes. Accordingly, with respect to a single first opening 205B, the amount and the shape of the second opening 207B would be variable, not limited to the embodiments aforementioned. Thus, the conductive material 209 in the first opening 205B would be easily filled into and with a designed height.

Alternatively, the screen printing method of conductive material is applied to a wafer for the formation of conductive bumps. Accordingly, the wafer has a plurality of conductive bonding pads thereon. Each of the conductive bonding pads is aligned with an Under Bump Metallurgy (UBM) to provide a conductive surface. Then a dielectric layer is formed on the wafer. The dielectric layer exposes the conductive surface through a first opening. A mask, formed on the dielectric layer, is with a plurality of second opening corresponding to the first opening. The conductive surface is exposed by the second opening thereon. The conductive surface is covered with a conductive material that flows into the first opening through the second openings. Then, the mask and the dielectric layer are removed. The conductive material is reflowed to form a plurality of bumps on the wafer.

Accordingly, variations of the embodiments described herein will become apparent to those having ordinary skill in the art, and such variations are within the scope of the present invention, as defined by the following claims.

What is claimed is:

1. A screen printing method of conductive material, comprising:
    providing a wafer with a conductive surface thereon;
    forming a dielectric layer on said wafer, wherein said dielectric layer exposes said conductive surface to a first opening;
    forming a mask on said dielectric layer, said mask with a plurality of second openings corresponding to said first opening, wherein said conductive surface is exposed by said second openings thereon, and any one of said second openings is smaller than said first opening;
    covering said conductive surface with a conductive material, wherein said conductive material flows into said first opening through said second openings; and
    removing said mask.

2. The screen printing method of conductive material according to claim 1, wherein said step of providing said wafer comprises:
    forming a conductive bonding pad on said wafer;
    forming a passivation layer covering said wafer, wherein said passivation layer exposes a portion of said conductive bonding pad; and
    forming an under bump metallurgy (UBM) on said portion of said conductive bonding pad, wherein said under bump metallurgy provides said wafer with said conductive surface.

3. The screen printing method of conductive material according to claim 1, wherein said mask is a stencil.

4. The screen printing method of conductive material according to claim 1, wherein said mask is a photo-resist stencil.

5. The screen printing method of conductive material according to claim 1, wherein said step of covering said conductive surface comprises covering said exposed conductive surface with a solder material by screen printing.

6. The screen printing method of conductive material according to claim 1, wherein said second openings are on said first opening.

7. A screen printing method of conductive material, comprising:
    providing a wafer with a conductive surface thereon;
    forming a dielectric layer on said wafer;
    removing a portion of said dielectric layer to expose a portion of said conductive surface;
    forming a mask on said dielectric layer, wherein said mask has a plurality of openings above said exposed conductive surface, and any one of said openings is smaller than said exposed conductive surface;
    screen printing a conductive material to cover said exposed conductive surface, wherein said conductive material flows toward said exposed conductive surface through said openings; and
    removing said mask.

8. The screen printing method of conductive material according to claim 7, wherein said mask is a stencil.

9. The screen printing method of conductive material according to claim 7, wherein said music is a photo-resist stencil.

10. The screen printing method of conductive material according to claim 7, wherein said conductive material is made of a solder material.

11. A formation method of bumps applied to a wafer having a plurality of conductive bonding pads thereon, each of which aligned with an under bump metallurgy (UBM) to provide a conductive surface, said formation method of a bump comprising:
    forming a dielectric layer on said wafer, wherein said dielectric layer exposes said conductive surface through a first opening;
    forming a mask on said dielectric layer, said mask with a plurality of second openings corresponding to said first opening, wherein said conductive surface is exposed by said second openings thereon, and any one of said second openings is smaller than said first opening;
    covering said conductive surface with a conductive material, wherein said conductive material flows into said first opening through said second openings;
    removing said mask and said dielectric layer; and
    reflowing said conductive material to form said bump on said conductive surface.

12. The formation method of bumps according to claim 11, wherein said mask is a stencil.

13. The formation method of bumps according to claim 11, wherein said mask is a photo-resist stencil.

14. The formation method of bumps according to claim 11, wherein said step of covering said conductive surface comprises covering said exposed conductive surface with a solder material by screen printing.

15. The formation method of bumps according to claim 11, wherein said second openings are on said first opening.

* * * * *